340-567
6/26/79            XR        4,159,473

United States Patent [19]
Senk

[11] 4,159,473
[45] Jun. 26, 1979

[54] CHARGE SENSITIVE SWITCH

[75] Inventor: Miro Senk, Montreal, Canada

[73] Assignee: Johnson-Lazare Canada Limited, Montreal, Canada

[21] Appl. No.: 792,811

[22] Filed: May 2, 1977

[30] Foreign Application Priority Data

May 28, 1976 [CA] Canada ................. 253632

[51] Int. Cl.² ........................................... H01H 36/00
[52] U.S. Cl. ................................... 340/565; 307/116; 328/5; 340/561; 340/567; 340/664; 361/94
[58] Field of Search .......... 340/258 R, 258 C, 258 B, 340/365 E, 365 C, 253 A, 561, 562, 567, 565, 664; 307/38, 116, 308; 200/DIG. 1, DIG. 2; 328/5; 361/94

[56]            References Cited
        U.S. PATENT DOCUMENTS

| | | | |
|---|---|---|---|
| 2,390,221 | 12/1945 | Lindsay et al. | 340/258 C |
| 3,493,791 | 2/1970 | Adelson et al. | 340/365 C |
| 3,919,596 | 11/1975 | Bellis | 340/258 C |
| 4,031,408 | 6/1977 | Holz | 340/258 C |

*Primary Examiner*—Glen R. Swann, III
*Attorney, Agent, or Firm*—Charles A. Laff; J. Warren Whitesel; Howard B. Rockman

[57]            ABSTRACT

A charge-sensitive switch is described sensitive to the adjacency of, or transfer of charge from a person, for controlling lamps, appliances, motors, etc. The switch contains an over-current sensor for detecting excess load current, and takes action to shut off the current. It can also switch successive loads, as would be required in a tri-light lamp. The input sensitivity of the switch is adjustable so as to be able to switch in the presence of an adjacent charge, as would be required for proximity detection in a burglar alarm.

28 Claims, 4 Drawing Figures

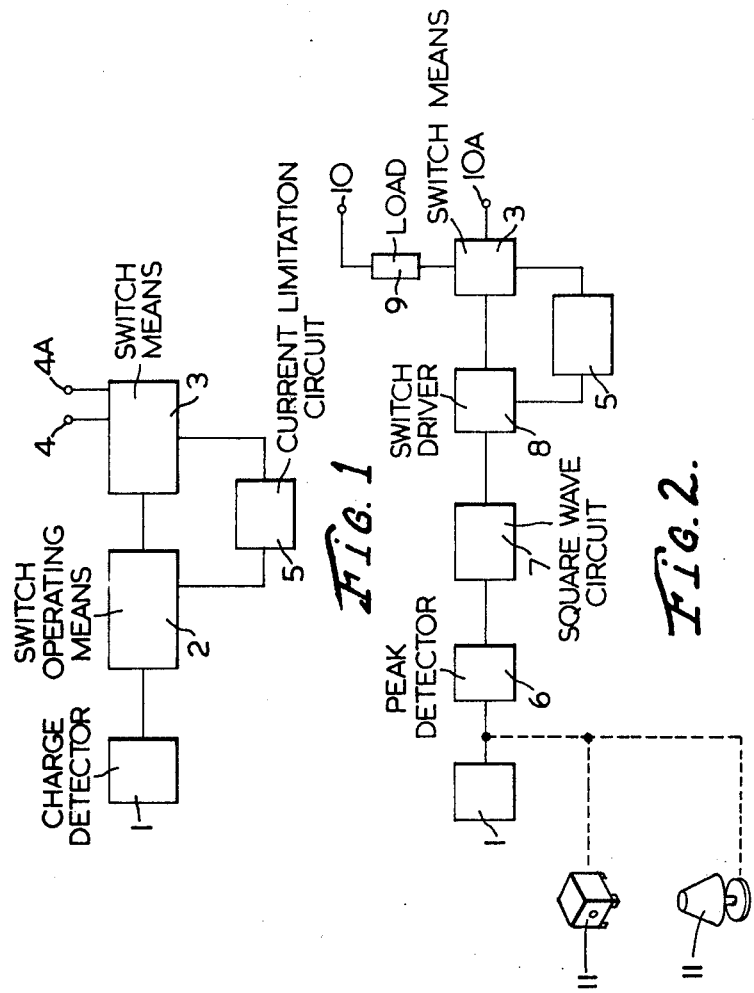

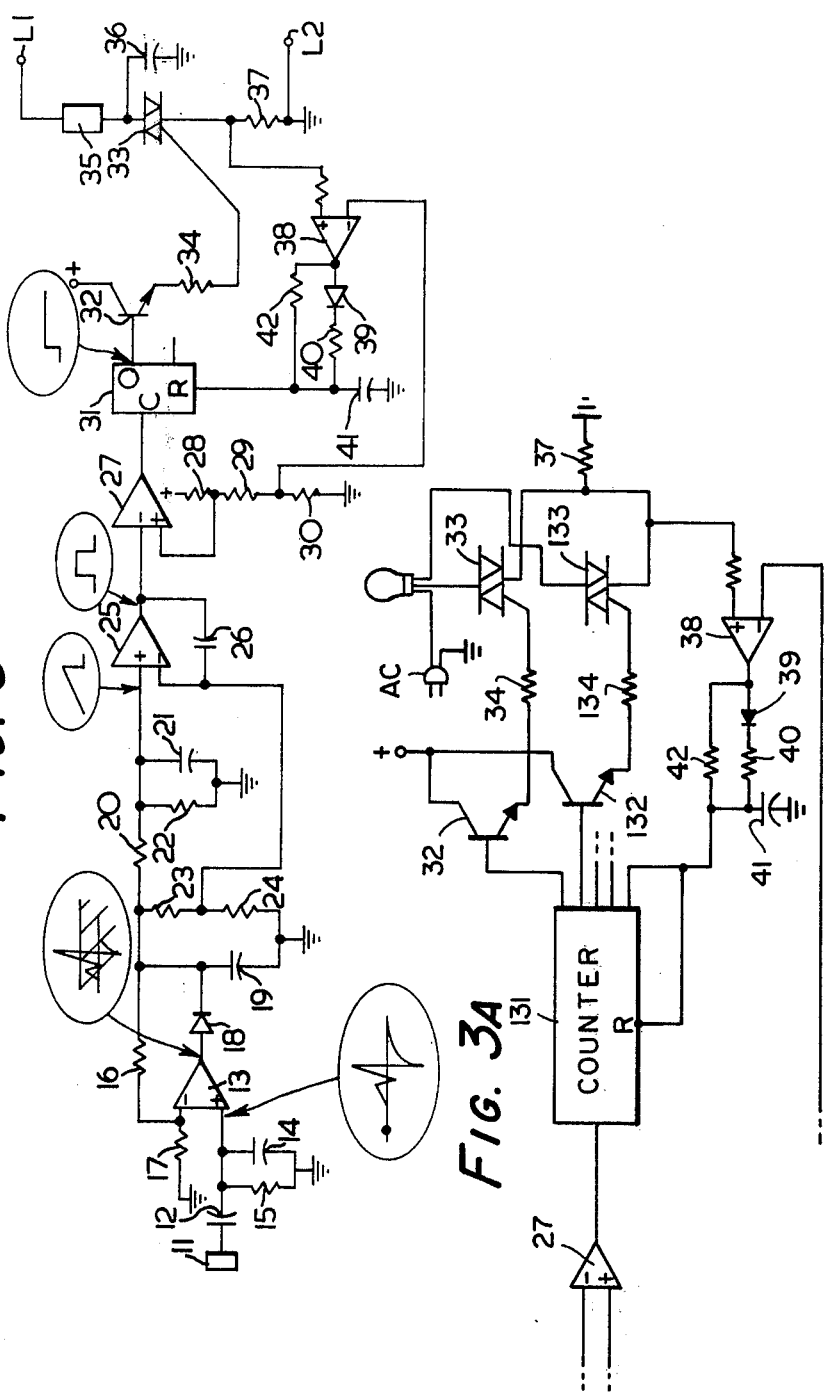

CHARGE SENSITIVE SWITCH

BACKGROUND

This invention relates to a switch which is sensitive to a pulse of charge imparted to a conductive sensor, as by touching it with the hand of a person, and therefore can be used to control the operation of a variety of appliances.

Touch-sensitive electronic switches which do not utilize a user-activated bending of a spring to effect an electrical contact, are used frequently for the operation of elevators, etc. While the application of this type of electronic switch has been previously attempted for the control of lamps, electrical motor-driven appliances, etc., the switches have not found wide usage for control of those appliances, due to a number of problems.

Charge sensitive electronic switches commonly use silicon controlled rectifiers or silicon controlled switches in the heavy current load circuit. Excess load, i.e., high current in excess of the design maximum of the semi-conductor switch frequently destroys the switch. Consequently the use of a silicon controlled switch to control a lamp designed for a maximum 60 watt light bulb, could cause destruction of the silicon controlled switch if, for instance, a 150 watt light bulb is inserted into the lamp socket, unless the silicon controlled switch has sufficient overcurrent capacity to handle, on a continuing basis, particular overcurrents. However, temporary short circuits within the light bulb, or the placement of still higher wattage light bulbs in the lamp socket by the consumer, could cause failure of the silicon controlled switch, even with a reasonable amount of overcurrent capacity.

In addition, when a user touches a "touch plate" sensor by merely brushing the hand over it, a rapid sequence of charge pulses may be imparted to the switch, which could cause the light bulb to flicker on and off, in a lamp, giving the impression of a non-positive and unreliable contact closure. Even in the absence of the above sequence of charge pulses, a user might sequentially turn the switch on and off on purpose very rapidly, possibly causing damage to the appliance due to too frequent current surges.

Furthermore, it has been found that persons of various body sizes will impart various amounts of charge to a sensor touch plate. A child may carry a very small amount of charge, while a tall person may carry a significantly larger charge. A switch which has been designed to be sensitive to the charge of a child, may be so sensitive as to pick up stray charges present in the air on a dry winter day, causing operation of the switch-operated appliance in a sporadic and unreliable manner.

It is believed that due to the aforenoted problems, charge-operated electronic switches have not found wide use to control appliances which must be operated by children as well as adults (as in a table lamp), or with appliances which are generally used by the consumer in an uncontrolled environment.

The present invention contains a unique structure whereby the aforenoted problems with prior art switches are overcome. The present charge-operated switch contains an overcurrent detector, which senses excessive current which would otherwise damage the silicon controlled switch, and takes action to shut the current off. The present charge-sensitive switch can therefor be used with an appliance which is subject to user-induced overload, and be immune from overload current-draw damage.

The present invention also contains means for accepting charge pulses following a first charge pulse only after a predetermined interval has lapsed. Accordingly, if a number of charge pulses are imparted to the switch sensor in rapid succession, only the first will be sensed, and the appliance turned on or off. After the aforenoted time period, a further pulse will be accepted. Accordingly, the aforenoted flickering, unstable or indeterminate operation of the light bulb is avoided and the appliance will be turned on or off with certainty and reliability.

According to the present invention, as well, a charge pulse applied to the same sensor will turn the switch on or off, in successive steps. Prior art switches in the main have required two touch plates, or a mechanical reset button elsewhere in the circuit.

A feature of one embodiment of the invention is the provision of a switch which can sequentially turn on a number of circuits. This embodiment can be used in the operation of multi-filament (e.g. three way) light bulbs, or be used to control apparatus utilizing sequentially operated activation.

In addition, the present invention can have its sensitivity varied at will. Preferably, the sensitivity is prefixed at a level which will allow it to be operated by a variety of charge pulses, for instance from a small-bodied child, to a large adult.

However, it should be noted that the sensitivity of the switch can be set so high, that a charge carrying person only approaching near the charge sensor can operate the switch. Accordingly, there is substantial utility of the invention in the provision of charge sensors encompassing the metal frame of a storage safe, or a wire behind the frame of valuable pictures in an art gallery, etc. The silicon controlled switch can be used in an alarm circuit, whereby too-near approach of a visitor to the art gallery, to a wired picture will set off an alarm and summon a guard. Similarly, the near approach of a burglar to a suitably wired safe can provide an alarm, as noted above.

It should be noted that the term "silicon controlled switch" is intended to be used generically, and includes devices such as silicon controlled rectifiers, or other electronic switches. The use of the term "switches" is intended to be generic to silicon controlled switches, as noted above, as well as relays and other electrically operated switching structures, which provide a heavy current switched path upon reception of an input operation signal.

SUMMARY

In general, the present charge-sensitive switching means is comprised of detecting means for detecting the presence of electrical charge which is increased over a predetermined steady state level, coupled to switch operating means for providing a signal output in response to the detection of the increased electrical charge. Switch means is connected to the switch operating means and is responsive to the signal output, for switching a current through a load. A current limitation circuit detects the passage of a predetermined or higher level of said current, and causes the switch operating means to cause the switch means to switch off the current upon detection of the predetermined or higher level of current.

In another embodiment, the detecting means comprises charge storage means for storing a charge representative of the detected charge. Charge leakage means discharges the stored charge over a predetermined interval. The interval provides a time period during which additional increased charge received by the detector will not cause the switch to be activated or deactivated.

In a further embodiment, the charge which is sensed is a pulse, a proportion of which is stored. Variation of the proportion which is stored can provide a sensitivity variable for the present switch.

BRIEF DESCRIPTION OF THE DRAWINGS

A more detailed description of the invention is given below, and reference is made to the following drawings, in which:

FIG. 1 is a general block diagram of the invention in broadest form,

FIG. 2 is a block diagram of the invention in more detailed form,

FIG. 3 is a detailed schematic of the invention, useful for an understanding of all embodiments, and FIG. 3A is a detailed schematic of a variation of a portion of FIG. 3.

DESCRIPTION OF THE PREFERRED EMBODIMENTS

Turning now to FIG. 1, a charge detecting means 1 is shown, which senses the presence of an electrical charge increased over a predetermined steady state level. The sensed charge can be provided by a charge-carrying body approaching an antenna sensor, or can be a charge-carrying body touching an antenna sensor, imparting a flow of charge thereto.

The output of the detecting means 1 is connected to a switch operating means 2. The switch operating means provides an output signal in response to the detection of the aforenoted electrical charge.

A switch means 3 is connected to the output of the switch operating means, and is responsive to the signal output for switching of current through a load. Terminals for connection to the load and source of current are shown as reference numerals 4 and 4A.

A current limitation circuit 5 detects the passage of a predetermined or higher level of the current passing through the load. In response to the detection of the predetermined or higher level of current, the current limitation circuit causes the switch operating means 2 to cause the switch means 3 to switch off the current. Accordingly, a limitation on the maximum amount of current which is allowed to flow through the load is provided.

In operation, a current source and load through which the current is to be passed are connected in series with terminals 4 and 4A. Switch means 3 provides a "make" switch function; without activation, the switch is open-circuited, stopping the flow of external current through the load.

To cause the switch to operate, a charge is imparted to the charge detecting means 1, as by touching a touch-plate sensor, or bringing a charge carrying body near thereto. The sensing of the charge by charge detector 1 causes the switch operating means 2 to provide a signal which operates the switch means 3. The make switch therein closes, causing current to flow through the load.

In order to stop current from flowing through the load, the touch-plate is again touched, providing an increase of charge thereto, which results in the switch operating means removing the signal previously applied to the switch means, causing the switch means to open.

It should be noted that imparting charge to the charge detecting means sequentially can cause the sequential opening and closing of a make contact or its equivalent in switch means 3. In this respect, the invention has operated, although is not structurally similar, as the switch described in U.S. Pat. No. 3,666,988, issued May 30, 1972 to R. E. Bellis.

However, in the present invention, should an overload condition occur, e.g., by replacing a switched light bulb load with one of excessive wattage, or due to the presence of a short circuit, the flow of current at a predetermined level or in excess thereof will cause the current limitation circuit to deactivate the switch operating means, to remove the operation signal from the switch means, causing it to shut off before either the load or the switch means is damaged by the excess current.

Preferably, the charge imparted to the charged detecting means is a pulse. FIG. 2 shows a block diagram of the circuit which is responsive to the input of a charge pulse.

Charge detector 1 provides an output signal to a peak detector 6. The peak detector corrects for bounce, or negative transient voltage resulting from the normally irregular charge pulse. Peak detector 6 is connected to the input of a square wave producing circuit 7. Upon sensing of a significant charge pulse, the peak detector activates the square wave producing circuit to produce a square wave output signal.

The square wave producing circuit 7 is connected to a switch driver 8, which in turn has its output connected to switch means 3. Upon production of a square wave resulting from the original input of a significant charge pulse, the square wave at the output of square wave producing circuit 7 will activate the switch driver 8, which provides a DC output signal to switch means 3.

A make contact, or a circuit equivalent, of switch means 3 is connected in series with load 9 to a source of load current, at terminals 10 and 10A.

Current limitation circuit 5 is connected between the line carrying the load current, shown here within the switch means 3, and the switch driver 8. Upon sensing of an excessive amount of current drawn by the load, the current limitation circuit 5 causes switch driver 8 to remove the DC output signal which has been enabling switch means 3. This shuts off switch means 3, causing open-circuiting of the load current-carrying line. Thus the current is removed from the load, protecting the load and the switching means from excessive current.

It should be noted that the load current will not be switched on again until an additional charge pulse is detected by the charge detecting means 1. If the overcurrent condition is still present, this will be sensed immediately, and the switching means opened immediately after reclosing. In the case of a light bulb load, it simply flashes on and immediately shuts off.

In one embodiment, the charge detecting means comprises means for storing a charge representative of the detected charge. Once stored, with the switching means turned on, additional detected charge has no effect on the operation of the switch, since the stored charge is already in excess of a predetermined steady state level. Consequently the switch would stay on.

A controlled leakage path is provided for discharging the stored charge over a predetermined interval. Consequently the level of stored charge decreases over a time period, and finally reaches the predetermined level. After that time period has passed, additional charge sensed by the charge detecting means will cause operation of the switch, for instance causing open-circuiting of switch means 3. The leakage time period therefore provides an interval during which the switch is insensitive to further operation (except in the case of overcurrent). It is preferred to fix the leakage time period at between one-half second and two seconds. A user could not therefor turn the current to the load on and off in too rapid succession, which could cause damage thereto. In addition, once the current has been turned on or off, it will be seen to be turned on or off positively. The problem resulting from lightly trailing the finger over the touch-plate, which would otherwise possibly impart sequences of eratic static pulses to the touch-plate and give an impression of unreliability of contact, is avoided.

Furthermore, the proportion of charge which is stored, to that imparted by a user is variable by charge (or voltage) dividing. The higher the ratio of imparted to sensed charge detected, the more sensitive the switch will be. For use as an environmental intruder detector, for burglar alarm use, a very high ratio, such as close to unity, may be desirable. However for normal consumer home switch use, i.e. use to operate a household lamp by children as well as adults, a considerably lower ratio would be desirable.

It would be noted that the switch driver 8 can be comprised of a counter, which counts the input pulses. An output DC signal is provided at a plurality of output terminals, the respective output terminal which carries the output signal being determined by the count. Individual switch means are connected to each of the output terminals, and are individually activated by a DC output signal appearing thereat.

Accordingly, successive input pulses will cause successive switch means to close external current circuits through individual loads, in succession. This can be used for the control of a variety of circuits. For instance, where a four stage ring counter is used, individual switches connected to the first three successively counted output terminals of the counter can successively activate the three filaments of a trilight bulb. A count resulting in a signal at the fourth terminal will not activate any of the switches, and the lamp will be in an off condition. Alternatively, a straight counter can be used. In this case, the output signal at the fourth counted output terminal would be applied to a reset input of the switch driver, causing it to remove all output signals, or to resort to a zero condition, turning the switching means off.

FIG. 3 is a schematic diagram of the invention in detail. Circled signal waveforms designate representative signals at various points.

An antenna for sensing the charge is provided as touch-plate 11. The touch-plate of course can be the conductive metal housing of a lamp base, a conductive wall light switch cover plate (sans switch hole), or the like.

The touch-plate is connected through capacitor 12 to differential amplifier 13.

A charge storage capacitor 14 stores the charge coupled through capacitor 12 from touch-plate 11. It should be noted that capacitors 12 and 14 form an A.C. voltage or charge divider, and their relative capacitances can provide means for adjusting the sensitivity of the circuit, as described earlier. It has been found that capacitor 12 of 0.001 microfarads and capacitor 14 of 0.05 microfarads are useful for a household lamp control. These values may be varied, however, for different applications.

A leakage path comprising resistor 15, in parallel with capacitor 14 to ground provides a leakage path for the charge stored on capacitor 14. The time constant of capacitor 14 with resistor 15 provides the earlier-described delay between acceptance of activating charge pulses. A useful range for the time constant is between one-half and two seconds, although a one to one and one-half seconds time constant has been found to be desirable. The junction of capacitors 12 and 14 is connected to the + input of differential amplifier 13.

Differential amplifier 13 is connected as a normal operational amplifier, with feedback resistor 16 connected between the output of amplifier 13 and the second input. Resistor 17 connects the negative input to ground.

It should be noted that resistor 17 provides a bias, relative to the first input of amplifier 13 which must be overcome before amplifier 13 will conduct. Consequently the bias provides a level over which a charge pulse must have amplitude in order to activate the circuit. Consequently the value of resistor 17 will also control the sensitivity to a certain extent.

It is preferred that the amplifier 13 be connected to a rectifier diode 18 at its output circuit. Since the input charge pulse will not be a cleanly positive-going and cleanly terminating pulse and will often contain variations of amplitude which are negative in polarity, diode 18 rectifies the input pulse to a positive-going pulse. An adjustment of resistor 17 provides a common potential level over which the potential of the input to the operational amplifier must exceed, in order to activate the circuit. The output of the diode 18 will therefore be the peak of the positive-going pulse which has exceeded a minimum predetermined level.

The output of diode 18 is applied to capacitor 19, which is connected between the cathode of diode 18 and ground. The function of capacitor 19 is to integrate the pulse received from the diode. The signal is carried through resistor 20 to capacitor 21, which latter elements provide a further integrating function. Resistor 22 by-passes capacitor 21 to ground, to provide a leakage path around capacitor 21. The signal at the junction of resistor 20 and capacitor 21 will be a ramp voltage; the end of the peak pulse will end integration and storage in capacitors 19 and 21. Leakage to ground will then occur through resistor 22, terminating the ramp.

A voltage divider comprising series resistors 23 and 24, connected across capacitor 19 to ground, provides a potential source for the negative input of a differential amplifier 25, the positive input of the amplifier being connected to the junction of resistor 20 and capacitor 21. A differential divider circuit is thus provided.

Capacitor 26 is connected between the output of differential amplifier 25 and the negative input thereof, whereby a square wave output pulse is produced during a portion of the ramp input signal.

The square wave signal is passed through a differential amplifier 27, although this amplifier can be deleted if a sufficiently high amplitude square wave is normally received from amplifier 25. The negative input of amplifier 27 receives the square wave signal, and the positive input is connected to a source of bias, which can be provided by a voltage dividing series of resistors 28, 29, and 30, which resistors are connected between a source of positive potential and ground.

The output of differential amplifier 27 is connected to the input of a J-K flip flop 31. One of the output terminals of J-K flip flop 31 is connected to the base of driver transistor 32, which, when turned on, establishes a voltage level in its collector-emitter circuit for enabling a power or line current switch.

A silicon controlled switch 33 (or silicon controlled rectifier) has its gate connected through resistor 34 to the emitter of NPN driver transistor 32. The cathode of the silicon controlled switch is connected to ground, and the collector of driver transistor 32 is connected to a source of positive potential. The anode of silicon controlled switch 33 is connected through load 35 to a source of line current at terminal L1. The return source of current at terminal L2 is connected to ground. A capacitor 36 is connected in parallel with the cathode-anode terminals of silicon controlled switch 33 in order to protect it from line transients. The load 35 can be a light bulb, and terminals L1 and L2 connected to a source of 117 volts AC. The load 35 can alternatively be a motor, or another circuit to be controlled.

In order to detect excessive current, a low valued resistor 37, typically a fraction of an ohm, is connected in series with the line current which flows through load 35. The voltage drop derived thereby is applied to differential amplifier 38. One (negative) input of the differential amplifier 38 is connected to a source of bias potential, as may be derived at the junction of voltage divider resistors 29 and 30, one terminal of the latter being connected to ground, i.e., to one terminal of resistor 37. The other input of amplifier 38 is connected to the other terminal of resistor 37.

At this point it should be noted that since touch-plate 11 is connected through capacitor 12 and resistor 15 to ground, the latter being by-passed by capacitor 14, care should be taken to ensure that the voltage ratings of capacitors 12 and 14 are sufficiently high so as not to fail with expected charge levels. During imparting of a charge by a person touching touch-plate 11 and also touching a grounded external element, a circuit can be completed from ground through to live 117 volts via capacitors 12 and 14 and resistor 15 in the event that terminals L1 and L2 are connected to the AC mains in reverse, with terminal L1 connected to earth ground and terminal L2 connected to the "hot" side of the line. The resistance value of resistor 15, with the impedance of capacitor 12 in series must also be sufficiently high to maintain a very small amount of leakage under the aforenoted conditions.

For safety sake, it is desirable to polarize an AC mains plug to insure that terminal L2, connected to circuit ground, is also connected to external mains earth ground.

Returning to the operation circuit for differential amplifier 38, the value of resistor 30 will determine a minimum voltage drop across resistor 37 which will cause differential amplifier 38 to pass a signal.

It should be noted that where terminals L1 and L2 are connected to a source of AC current, an alternating voltage will appear across resistor 37. Consequently differential amplifier 38 will conduct during a unidirectional excursion of the current (say, positive, for the polarity shown), once the bias level establishing the minimum conduction voltage value has been exceeded. This value will of course be set at a level higher than the normal expected load current, but less than the current level which would damage the silicon controlled switch.

The output of differential amplifier 38 is passed through diode 39, which has its cathode connected through resistor 40. The other terminal of resistor 40 is connected through capacitor 41 to ground. Capacitor 41 provides an integrating function, with a charge time constant determined by the resistance in series with capacitor 41 taken together with the capacitance of capacitor 41.

Diode 39 serves to stop leakage backward through differential amplifier 38 which would otherwise pass through resistor 40. However, a controlled discharge of capacitor 41 is provided by resistor 42, which is connected in parallel with a series circuit of diode 39 and resistor 40. Since under normal circuit requirements there will be a discharge path from the output of differential amplifier 38 to ground within the amplifier, discharge of capacitor 41 to ground will be controlled through resistor 42, with a different, longer, time constant than would be provided through resistor 40.

Accordingly, with an AC voltage input derived from resistor 37, the voltage across capacitor 41 will be stair-step in form, with the portion following the rise reducing slowly with time.

The junction of capacitor 41 and resistor 40 is connected to a reset input of flip flop 31. The signal applied thereto, in the presence of overcurrent in the load, will rise with each cycle until the reset voltage is reached. Once this occurs, flip flop 31 will be reset, removing the DC signal output applied to the base of transistor 32, causing silicon controlled switch 32 to open its cathode-anode circuit, terminating current flow through load 35. Once this occurs, decay of the voltage across capacitor 41 will occur because of current flow through resistor 42 and differential amplifier 38 to ground. The latter leakage time delay, and thereby the time for the voltage across capacitor 41 to reduce to a voltage lower than the reset voltage for J-K flip flop 31, can be set so as to provide a recovery period for silicon control switch 33 and, if need be, load 35. The recovery time can be longer than the leakage time provided by capacitor 14 and resistor 15 at the input of the entire circuit.

In operation, a person touches touch plate 11, imparting charge thereto. A proportion of the imparted charge is stored on capacitor 14, which charge immediately begins leaking to ground through resistor 15. The voltage resulting from the charge on capacitor 14 is amplified by differential amplifier 13, which is rectified by diode 18. The value of the voltage which will cause operation of amplifier 13 is set by the bias level provided by resistor 17. Consequently, a peak pulse which exceeds the predetermined bias level appears at the anode of diode 18.

The peak pulse is then integrated by capacitor 19, as well as by resistor 20 and capacitor 21. A proportion of the partly integrated voltage across capacitor 19 is applied to differential amplifier 25, as is the resulting voltage across capacitor 21, which appears as a ramp signal. The circuit including differential amplifier 25 provides a square wave pulse output, which is amplified in differential amplifier 27. The increased amplitude output square wave is applied to flip flop 31, which provides at its output, after being triggered, a constant DC output signal to the base of transistor 32. Transistor 32 switches on, causing the gate of silicon controlled switch 33 to go to a high potential level, turning switch 33 on. Line current which may be connected to terminals L1 and L2 is therefor allowed to pass through load 35.

A voltage drop resulting from line current flowing through the load is detected across resistor 37, and is applied to one input of differential amplifier 38. Under normal load conditions, due to bias applied to the other input of amplifier 38 no signal will be passed therethrough. However, under overcurrent conditions, the voltage across resistor 37 will be sufficient to overcome the input differential bias on differential amplifier 38, resulting in a pulsating D.C. or an A.C. signal passing therethrough. This is rectified and stored in capacitor 41. Once sufficient charge, built up as a stair-step waveform, has been accumulated, raising the voltage on capacitor 41 to the reset voltage required for flip flop 31, the flip flop will be reset, removing the DC output from the base of transistor 32. This removes the enabling voltage from the gate of silicon controlled switch 33, causing it to open circuit its anode-cathode circuit, stopping the flow of current through load 35. Once shut-off has occurred, charge on capacitor 41 will leak back through resistor 42 to ground, until the voltage across capacitor 41 has reduced to zero or to a minimal value. The time delay until the reset voltage is reached is the time within which the switch cannot be reactivated.

Flip flop 31 could alternatively be a ring counter, having a plurality of output terminals. Each terminal would be connected to an enabling circuit for individual silicon controlled switches, similar to the one including transistor 32 shown. The cathodes of all the silicon controlled switches can be connected together, and through a single resistor corresponding to resistor 37 to ground. A single overcurrent detector can be connected in a similar manner to that shown across resistor 37, to the reset input of the ring counter. In the presence of an over-current, the ring counter will be reset, removing any output signals which might keep a silicon controlled switch operated. Alternatively, the cathodes can each be separate, and individual overcurrent detectors used, each connected to the reset input of the ring counter. The overcurrent detectors could alternatively be connected back to the input, to switch the ring counter to the next output, which could activate a higher time current tolerant circuit, etc.

It should be noted that in the circuit shown in FIG. 3, the reception by flip flop 31 of successive square wave pulses caused by reception of repeated charge pulses by touch-plate 11 will cause it to alternate an output signal between the output shown, and an output, not shown, which is disconnected. This will provide an operation signal to driver transistor 32 with alternate charge pulses, turning switch 33 on and off with successive touches to touch-plate 11.

Where a ring counter is used in place of flip flop 31, the reception of successive charge pulses will cause successive square waves to provide output signals at successive output terminals in sequence. Once the output has returned to the first count position, with no driver transistor connected thereto, no silicon controlled switch will receive an enable signal, and all outputs will be switched off.

If a normal linear counter is used, an output terminal at a particular count can be connected to its reset input, effectively returning the counter to its start position, and again removing all enabling output signals.

It should be noted that by suitable configuration of the circuit which operates the driver transistor 32, a different form of operation can be provided. For instance, the switch 33 can be made to operate with continuous touching of the touch-plate 11, and with removal of the touching body, the switch 33 is turned off. This type of circuit has utility where operation is desired during touching of an appliance, but automatic shut-off is obtained when the hand is removed. The antenna can thus be connected to a metal drill press handle, the handle of a personal hair dryer, a draftsman's electric eraser, etc. In this case, the capacitor 26 connected around amplifier 26 will be removed.

FIG. 3A illustrates a variation of the circuit of FIG. 3 to provide for the control of multiple circuits. Amplifier 27 is exactly the same as in FIG. 3, and all of FIG. 3's circuitry to the left of said amplifier is to be understood to be repeated in FIG. 3A. Counter 131 replaces flip-flop 31 of FIG. 3 and provides signal outputs on various output terminals in accordance with the number of charge pulses counted. Selected ones of these output terminals are connected to transistors 32, 132, etc. These transistors, when actuated by an output from counter 131, switch on their respective silicon-controlled switches 33, 133, etc. Conduction of the silicon-controlled switch actuates the circuit connected therethrough (the filaments of a multi-filament light bulb in the example illustrated). One of the outputs of counter 131 is connected to its reset terminal to cause all of the circuits to be deactivated and the system to be reset for the next cycle of operation. The remaining elements of FIG. 3A function exactly as the corresponding elements in FIG. 3, so no further discussion is needed.

Other modifications can be made within the spirit and scope of this invention. For instance, amplifier 27 can be removed if desired, and transistor 32 need not be provided if the switch operating means such as the flip flop 31 can internally provide enabling voltage for silicon controlled switch 33. A silicon controlled switch need not be used for some applications, and an electromagnetic relay, photo-isolated switch, or the like can be used. Other variations can be in the peak detector for reliably detecting the presence of input charge, the integrator, etc. The square wave producing circuit can be combined with the switch operating means under suitable circuit configuration. It is also contemplated that the major active signal-processing components be monolithically integrated.

The above variations, as well as others which may occur to a person skilled in the art are all considered within the scope of the present invention, which fall within the confines of the appended claims.

The embodiments of the invention in which an exclusive property or privilege is claimed are defined as follows:

1. A charge-operated switching means comprising:
   (a) detecting means for detecting the presence of electrical charge increased over a predetermined level,
   (b) switch operating means connected to the detecting means for providing a signal output in response to the detection of said electrical charge,
   (c) switch means connected to the switch operating means responsive to said signal output, for switching a current through a load, and
   (d) a current limitation circuit, for detecting the passage of a predetermined or higher level of said current and for causing the switch operating means to cause said switch means to switch off said current upon detection of said predetermined or higher level of current.

2. A charge operated switching means as defined in claim 1, in which the detecting means comprises charge storage means for storing a charge representative of the detected charge, and charge leakage means for discharging said stored charge over a predetermined interval.

3. A charge operated switching means as defined in claim 1, in which the detecting means comprises means for detecting a charge pulse, and the switch operating means comprises means for causing the switch means to switch off said current upon detection by the detection means of a succeeding pulse of electrical charge.

4. A charge sensitive switching means as defined in claim 1, in which the detecting means comprises means for detecting a charge pulse, the switch operating means comprises means for counting succeeding ones of said pulses, and providing signal outputs at output terminals numerically related to the number of charge pulses counted, the switch means comprising a plurality of switches each operated responsively to the presence of a signal output at a corresponding output terminal of the switch operating means.

5. A switching means as defined in claim 4, including means for causing the signal at an output terminal corresponding to one of said counts to cause the switch means to switch off said current.

6. A charge operated switching means comprising:
(a) detecting means for detecting a pulse of charge applied to a sensor means,
(b) means for converting the pulse to an activation signal,
(c) a switch driver means connected to the (b) means responsive to said activation signal for providing a signal output upon detection of the activation signal,
(d) switch means responsive to the presence of said signal output for closing an electric current circuit, and
(e) means for detecting the passage of a predetermined or higher level of current in said circuit, and for causing the switch driver means to cause the switch means to switch off said current upon detection of said predetermined or higher level of current.

7. A switching means as defined in claim 6, in which the switch driver has a reset input which, when activated, causes the removal of said signal output, and thus causes the switch means to open the electric current circuit; the current level detecting means further including a resistance means in the electric current circuit, and means connected to the reset input for sensing at least a predetermined voltage drop across the resistance means and responsively activating the reset input of the switch driver.

8. A switching means as defined in claim 7, in which the switching means is comprised of a silicon controlled switch, the resistance means being connected in series with the cathode circuit thereof for series connection with a load across an AC power source; said means for sensing a predetermined voltage drop comprising means for rectifying the voltage drop and integrating the resulting rectified voltage, the integrated voltage being applied to the reset input of the switch driver.

9. A switching means as defined in claim 8, in which the switch driver is comprised of a J-K flip flop, having an output terminal in an activation circuit connected to the gate of the silicon controlled switch.

10. A switching means as defined in claim 6, in which the activation signal is comprised of a square wave, and in which the detecting means includes a time delay circuit for activating the production of a succeeding square wave only after a predetermined period following the reception of a preceding charge pulse.

11. A switching means as defined in claim 6, in which the detecting means comprises charge storage means for storing a fraction of said pulse of charge and charge leakage means for discharging said stored charge at a predetermined rate, and means for activating the (b) means only upon reception of a succeeding charge pulse after the charge on the charge storage means has leaked to a predetermined low level.

12. A charge operated switching means comprising:
(a) an antenna terminal for collecting a charge pulse,
(b) means for rectifying and producing an unidirectional charge pulse, connected to the antenna terminal,
(c) integrating means for integrating the unidirectional charge pulse to a ramp signal, connected to the output of the (b) means,
(d) a pulse generating circuit connected to the integrating means for providing a square wave voltage pulse during a fraction of the period of the ramp signal,
(e) means for providing a continuous DC output signal upon reception of the square wave voltage pulse,
(f) a silicon controlled switch means having its gate means connected in a circuit to the (e) means for application of the DC output signal, and its anode-cathode circuit means connected in a circuit for providing line current to a load, and
(g) over-current detection means for detecting a predetermined or higher level of said line current and for causing the (e) means to remove the continuous DC output signal upon said detection.

13. A switching means as defined in claim 12, further including charge storage means connected to the antenna terminal for storing a fraction of said charge pulse, and charge leakage means for discharging said stored charge at a predetermined rate, the pulse generating circuit providing a voltage pulse only in the event the ramp signal is of predetermined amplitude, said amplitude being produced only upon the reception of a charge pulse succeeding a previous charge pulse by a predetermined time as determined by said charge leakage rate.

14. A switching means as defined in claim 13, in which the predetermined time is about ½ to 2 seconds.

15. A switching means as defined in claim 13, in which the (e) means is comprised of a J-K flip flop having a reset input connected to the output of the overcurrent detection means, including means for removing said continuous DC output signal upon reception of a succeeding square wave voltage pulse.

16. A switching means as defined in claim 13, in which the (e) means comprises counter means for counting succeeding ones of said square wave voltage pulses, and providing DC signal outputs at output terminals thereof numerically related to the total number of square wave voltage pulses counted, a plurality of silicon controlled switches having their respective gates connected to individual ones of said output terminals, individual switches each being operated responsive to the presence of a DC signal output at a corresponding output terminal connected to its gate, the cathode-anode circuits of the silicon controlled switches being connected in one or more circuits for providing line current to one or more loads; the counter means including means at a particular square wave count, for removing the DC signal output from all output terminals, and further including a reset input connected to the output of the overcurrent detection means for removing the DC signal output from all output terminals, whereupon the removal of the DC signal output, all silicon controlled switches are rendered open circuit.

17. A switching means as defined in claim 15, in which the overcurrent detection means includes means for providing a voltage proportional to said line current, rectifying said latter voltage, integrating the rectified voltage and applying said integrated voltage to said reset input.

18. A switching means as defined in claim 15, in which the overcurrent detection means includes a resistor in the line current circuit, means for detecting the voltage drop across said resistor, means for rectifying and integrating said detected voltage, and for applying the integrated voltage to said reset input.

19. A charge operated switch means comprising:
 (a) detecting means for detecting a pulse of charge applied to a sensor means,
 (b) switch operating means connected to the detecting means for providing a signal in response to the detection of said pulse,
 (c) switch means connected to the switch operating means responsive to said signal for switching a current through a load.
 (d) the detecting means comprising charge storage means for storing a fraction of said pulse of charge, and charge leakage means for discharging said stored charge at a predetermined rate, and means for activating the switch operating means only upon the reception of a succeeding charge pulse after the charge on the charge storage means has leaked to a predetermined low level.

20. A switching means as defined in claim 19, in which the switch operating means is comprised of a flip flop having an output for providing an enabling signal to the switch means in response to the detection of a charge pulse by the detection means, and for removing the enabling signal from the switch means upon the detection of a subsequent charge pulse by the detection means which arrives only following leakage of the stored charge to said predetermined low level.

21. A switching means as defined in claim 19, in which the switch operating means is comprised of a counter means for counting succeeding ones of detected charge pulses which are each spaced by the time for the stored charge to leak to said predetermined low level, and for providing DC signal outputs at output terminals of the counter means numerically related to the total number of pulses counted; said switch means comprising a plurality of silicon controlled switches having their respective gates connected to individual ones of said output terminals, individual switches being operated responsive to the presence of a DC signal output at a corresponding output terminal connected to its gate, the cathode-anode circuits of the silicon controlled switches being connected in one or more circuits for providing current to one or more loads; the counter means including means at a terminal corresponding to particular pulse count, for removing the DC signal output, whereupon all silicon controlled switches are rendered open circuited.

22. A charge operated switching means as defined in claim 19, in which the sensor means is comprised of a metal storage safe, which safe is insulated from ground, the load being connected in series with an alarm circuit.

23. A charge operated switching means as defined in claim 8, further including a lamp bulb connected in series with the anode-cathode circuit of the silicon controlled switch.

24. A charge operated switching means as defined in claim 16, further including a multi-element incandescent lamp bulb having one terminal of each element connected in individual anode-cathode circuits of silicon controlled switches which have their gates connected to successively activated terminals of the counter means.

25. A charge operated switching means as defined in claim 23, in which the antenna or sensor means is comprised of an externally accessible metal portion of a lamp fixture in which the lamp bulb is held, said metal portion being insulated from the lamp bulb line current conduction path and ground.

26. A switching means as defined in claim 15, in which the overcurrent detection means includes means for providing a voltage proportional to said line current, rectifying said latter voltage, integrating the rectified voltage and applying said integrated voltage to said reset input.

27. A switching means as defined in claim 15, in which the overcurrent detection means includes a resistor in the line current circuit, means for detecting the voltage drop across said resistor, means for rectifying and integrating said detected voltage, and for applying the integrated voltage to said reset input.

28. A charge operated switching means as defined in claim 24, in which the antenna or sensor means is comprised of an externally accessible metal portion of a lamp fixture in which the lamp bulb is held, said metal portion being insulated from the lamp bulb line current conduction path and ground.

* * * * *